(12) United States Patent
Abe et al.

(10) Patent No.: US 9,416,924 B2
(45) Date of Patent: Aug. 16, 2016

(54) LIGHT EMISSION MODULE

(71) Applicant: PANASONIC CORPORATION, Osaka (JP)

(72) Inventors: Masumi Abe, Osaka (JP); Yasufumi Wada, Osaka (JP); Toshifumi Ogata, Osaka (JP); Kenji Sugiura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 304 days.

(21) Appl. No.: 14/351,957

(22) PCT Filed: May 23, 2013

(86) PCT No.: PCT/JP2013/003280
§ 371 (c)(1),
(2) Date: Apr. 15, 2014

(87) PCT Pub. No.: WO2014/017005
PCT Pub. Date: Jan. 30, 2014

(65) Prior Publication Data
US 2014/0247597 A1      Sep. 4, 2014

(30) Foreign Application Priority Data

Jul. 25, 2012   (JP) .................................. 2012-164898

(51) Int. Cl.
*F21K 99/00*   (2016.01)
*F21S 8/02*   (2006.01)
(Continued)

(52) U.S. Cl.
CPC . *F21K 9/30* (2013.01); *F21S 8/026* (2013.01); *H01L 25/0753* (2013.01);
(Continued)

(58) Field of Classification Search
CPC ............... F21Y 2105/001; F21Y 2113/005; F21V 23/003; F21K 9/30; F21K 9/56; F21S 8/026; H01L 25/0753; H01L 2924/0002; H05B 33/0812; H05B 33/0821

USPC ..................................................... 257/99, 100
See application file for complete search history.

(56) References Cited

U.S. PATENT DOCUMENTS

| | | | |
|---|---|---|---|
| 8,899,789 B2 | 12/2014 | Chung et al. | |
| 2005/0057929 A1* | 3/2005 | Yano | F21K 9/00 362/240 |

(Continued)

FOREIGN PATENT DOCUMENTS

| | | |
|---|---|---|
| EP | 2397749 A2 | 12/2011 |
| JP | 2009-4129 | 1/2009 |

(Continued)

OTHER PUBLICATIONS

International Search Report and Written Opinion of the International Searching Authority in PCT/JP2013/003280, mailed Jul. 23, 2013.

(Continued)

*Primary Examiner* — Evan Dzierzynski
*Assistant Examiner* — Christopher E Dunay
(74) *Attorney, Agent, or Firm* — Greenblum & Bernstein P.L.C.

(57) ABSTRACT

In a mounting area, a plurality of light-emitting elements are two-dimensionally mounted, and light-emitting elements are connected in series in each of light-emitting element blocks. The light-emitting element blocks) are connected in parallel by wires. The light-emitting element blocks located in a middle portion each include only blue light-emitting elements. On the other hand, the light-emitting elements located above the light-emitting element blocks and the light-emitting element blocks located below the light-emitting element blocks include one or more light-emitting element blocks each including not only blue light-emitting elements but also one or more red light-emitting elements.

12 Claims, 10 Drawing Sheets

(51) Int. Cl.
*H05B 33/08* (2006.01)
*H01L 25/075* (2006.01)
*F21Y 101/02* (2006.01)
*F21Y 105/00* (2016.01)
*F21Y 113/00* (2016.01)

(52) U.S. Cl.
CPC ....... *H05B 33/0803* (2013.01); *H05B 33/0812* (2013.01); *H05B 33/0821* (2013.01); *F21K 9/56* (2013.01); *F21Y 2101/02* (2013.01); *F21Y 2105/001* (2013.01); *F21Y 2113/005* (2013.01); *H01L 2924/0002* (2013.01); *Y02B 20/343* (2013.01)

(56) References Cited

U.S. PATENT DOCUMENTS

| | | | | |
|---|---|---|---|---|
| 2008/0224608 A1* | 9/2008 | Konishi | ............ | F21K 9/00 313/505 |
| 2009/0152572 A1* | 6/2009 | Su | ............ | F21K 9/00 257/89 |
| 2010/0007267 A1* | 1/2010 | Imai | ............ | F21K 9/13 313/503 |
| 2010/0277905 A1* | 11/2010 | Janik | ............ | F21K 9/00 362/235 |
| 2011/0019420 A1* | 1/2011 | Kadotani | ............ | F21K 9/135 362/249.03 |
| 2011/0068709 A1* | 3/2011 | Ing | ............ | F21K 9/00 315/294 |
| 2011/0309381 A1 | 12/2011 | Betsuda et al. | | |
| 2011/0316009 A1* | 12/2011 | Fukasawa | ............ | H01L 25/0753 257/88 |
| 2012/0287620 A1* | 11/2012 | Guerrieri | ............ | F21V 23/003 362/231 |
| 2013/0088867 A1 | 4/2013 | Chung et al. | | |
| 2013/0249407 A1* | 9/2013 | Kashiwagi | ............ | H05B 33/0866 315/151 |
| 2013/0320870 A1* | 12/2013 | Oyaizu | ............ | F21K 9/1355 315/192 |
| 2014/0054628 A1 | 2/2014 | Sugiura et al. | | |
| 2015/0097201 A1* | 4/2015 | Imai | ............ | F21K 9/135 257/89 |
| 2015/0263246 A1* | 9/2015 | Hiramatsu | ............ | H01L 25/0753 362/231 |
| 2015/0345763 A1* | 12/2015 | Funakubo | ............ | F21V 21/00 362/296.01 |

FOREIGN PATENT DOCUMENTS

JP 2012-9622 1/2012
TW M422032 U1 2/2012

OTHER PUBLICATIONS

Extended European Search Report in EP 13823905.8, dated Oct. 26, 2015.

* cited by examiner

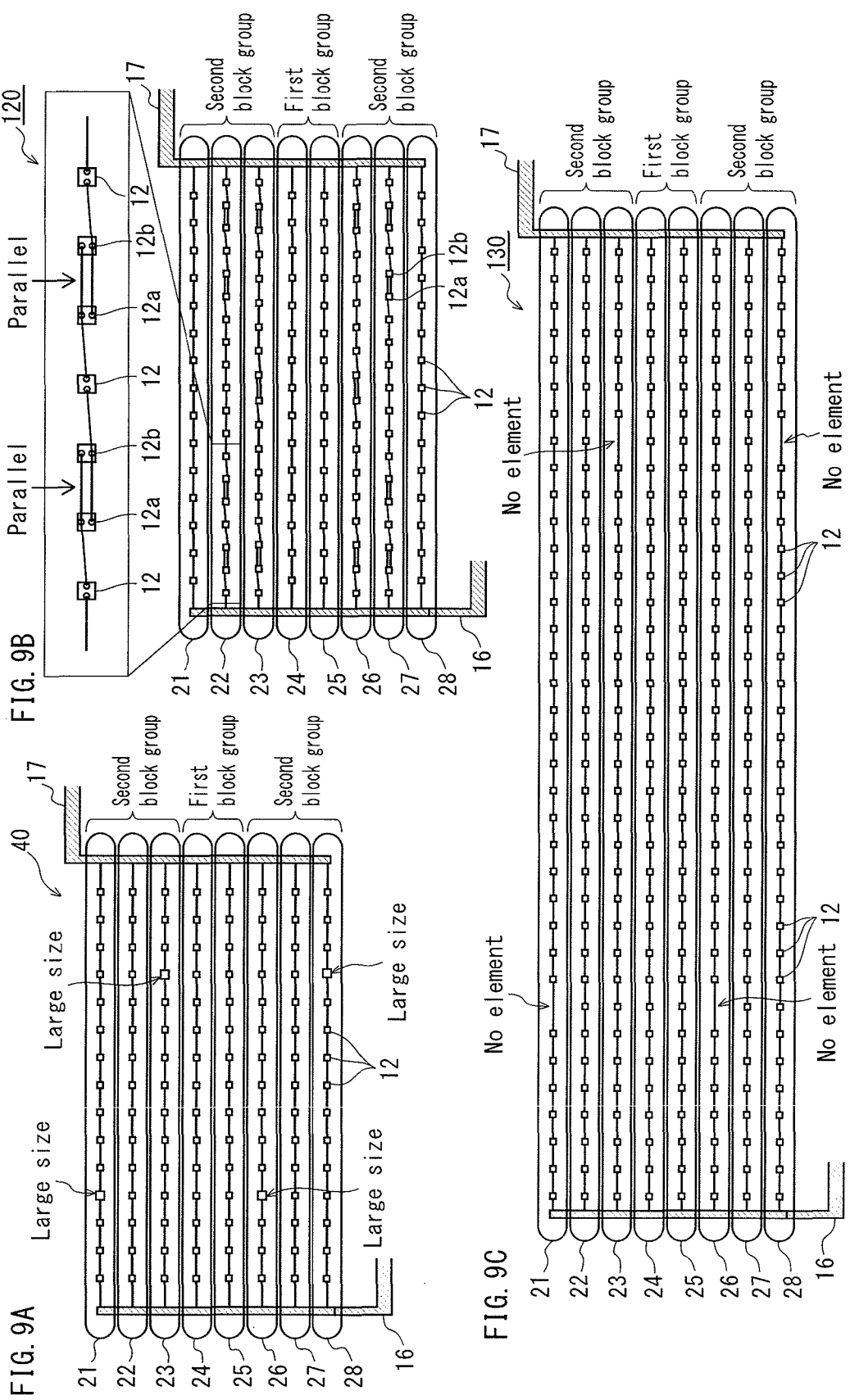

FIG. 10A
Embodiment 1

|  | Side portions | | | | | Middle portion |
|---|---|---|---|---|---|---|
| Light-emitting element block number | 21<br>32 | 22<br>31 | 23<br>30 | 24<br>29 | 25<br>28 | 26<br>27 |
| Current (mA) | 44 | 50 | 56 | 56 | 50 | 44 |
| Power consumption (W) | 2.7 | 3.1 | 3.5 | 3.5 | 3.1 | 2.7 |
| Power consumption ratio | 87% | 100% | 113% | 113% | 100% | 87% |

Voltage across each light-emitting element block : 62V
Total power consumption of light-emitting module : 37.2W FIG. 10B
Embodiment 2

|  | Side portions | | | Middle portion |
|---|---|---|---|---|
| Light-emitting element block number | 21<br>28 | 22<br>27 | 23<br>26 | 24<br>25 |
| Current (mA) | 52 | 48 | 52 | 48 |
| Power consumption (W) | 2.72 | 2.51 | 2.72 | 2.51 |
| Power consumption ratio | 94% | 108% | 104% | 94% |

Voltage across each light-emitting element block : 52.3V
Total power consumption of light-emitting module : 20.9W FIG. 10C
Embodiment 3

|  | Side portions | | | Middle portion |
|---|---|---|---|---|
| Light-emitting element block number | 21<br>28 | 22<br>27 | 23<br>26 | 24<br>25 |
| Current (mA) | 47 | 54 | 52 | 47 |
| Power consumption (W) | 2.45 | 2.81 | 2.71 | 2.45 |
| Power consumption ratio | 94% | 108% | 104% | 94% |

Voltage across each light-emitting element block : 52.1V
Total power consumption of light-emitting module : 20.8W FIG. 10D
Embodiment 4

|  | Side portions | | | Middle portion |
|---|---|---|---|---|
| Light-emitting element block number | 21<br>28 | 22<br>27 | 23<br>26 | 24<br>25 |
| Current (mA) | 55 | 45 | 55 | 45 |
| Power consumption (W) | 6.85 | 5.60 | 6.85 | 5.60 |
| Power consumption ratio | 94% | 108% | 114% | 94% |

Voltage across each light-emitting element block : 124.5V
Total power consumption of light-emitting module : 49.8W

LIGHT EMISSION MODULE

TECHNICAL FIELD

The present invention relates to a light-emitting module including light-emitting elements, such as LEDs, two-dimensionally mounted on a substrate.

BACKGROUND ART

Light-emitting modules including LEDs are widely used as backlights in lighting devices and display devices, as they have advantages of having long lives, being compact, having high luminous efficiency, and emitting bright light. As a light-emitting module for use in large-capacity lighting devices, such as downlights, a light-emitting module that includes a great number of LED chips two-dimensionally mounted on a substrate and covered with sealing materials has been developed.

As for such a light-emitting module that includes a great number of LED chips two-dimensionally mounted, the light-emitting device disclosed in Patent Literature 1 has a balanced overall circuit structure by setting the number of LED chips in each of rows connected in parallel to be the same.

In the light-emitting module including a great number of LED chips mounted on a substrate as described above, the LED chips are typically mounted in a mounting area of the substrate with high density.

CITATION LIST

Patent Literature

Patent Literature 1

Japanese Patent Application Publication No. 2012-9622

SUMMARY OF INVENTION

Technical Problem

The light-emitting module including the LED chips mounted with high density has a problem that heat generated by light emission of the LED chips is accumulated in the mounting area, and the temperature is likely to be high particularly in and near a middle portion of a light-emitting area.

When the temperature of the LED chips becomes high, deterioration of the LED chips themselves, decreasing luminous efficiency, and a change in color tone can be caused.

The present invention has been conceived in view of the above-mentioned problem, and aims to reduce the temperature rise in the middle portion of the mounting area of the light-emitting module that includes a plurality of light-emitting element blocks arranged on a substrate and connected in parallel, each of the light-emitting element blocks including a plurality of light-emitting elements connected in series.

Solution to Problem

In order to achieve the above-mentioned aim, a light-emitting module pertaining to one aspect of the present invention is a light-emitting module including a plurality of light-emitting element blocks two-dimensionally arranged on a substrate and connected in parallel, each of the light-emitting element blocks including a plurality of light-emitting elements connected in series, wherein the light-emitting element blocks are divided into: one or more light-emitting element blocks belonging to a first block group, located in a middle portion; and a plurality of light-emitting element blocks belonging to a second block group, located on opposite sides of the first block group, and one or more of the light-emitting element blocks belonging to the second block group each consume more power than each of the one or more light-emitting element blocks belonging to the first block group.

Advantageous Effects of Invention

According to the above-mentioned aspect, the one or more light-emitting element blocks belonging to the first block group located in the middle portion each consume less power than each of the one or more of light-emitting element blocks belonging to the second block group located on opposite sides of the first block group. Thus, the temperature is made uniform in the middle portion and in the side portions, and the temperature rise in the middle portion is reduced.

BRIEF DESCRIPTION OF DRAWINGS

FIG. 9A illustrates a light-emitting module 110 pertaining to Embodiment 2, FIG. 9B illustrates a light-emitting module 120 pertaining to Embodiment 3, and FIG. 9C illustrates a light-emitting module 130 pertaining to Embodiment 4.

FIGS. 10A-10D are tables showing power and other values of each light-emitting element block at the time of driving the light-emitting modules pertaining to Embodiments 1-4.

DESCRIPTION OF EMBODIMENTS

<Background Leading to Invention>

Figure 1:
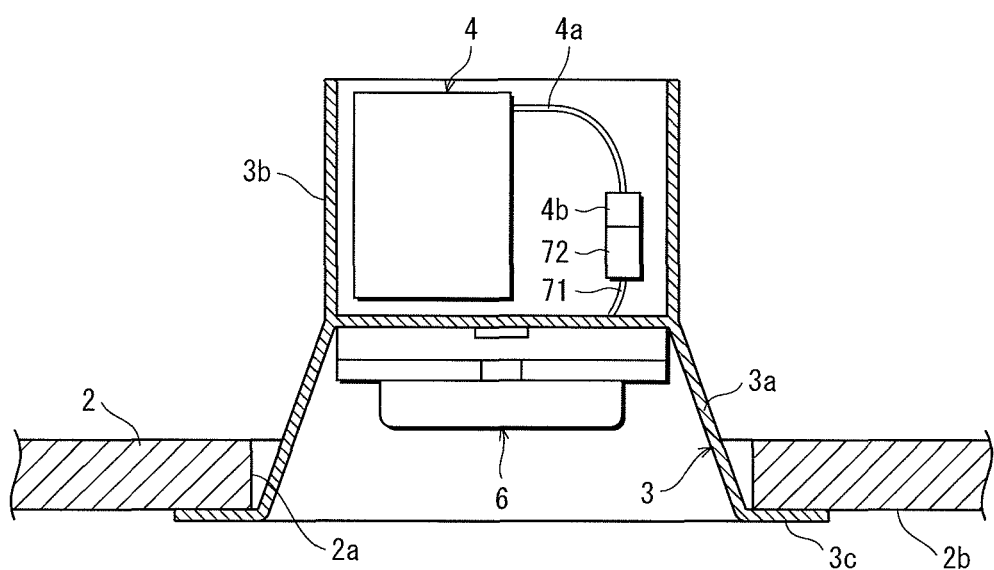
FIG. 1 is a sectional view of a lighting device 1 including a light-emitting module 10 pertaining to an embodiment.

The inventors explored the method for reducing the temperature rise in the light-emitting module that includes a plurality of light-emitting element blocks two-dimensionally mounted on a substrate and connected in parallel, each of the light-emitting element blocks including light-emitting elements connected in series.

In the exploration, the inventors focused on the fact that, by setting a light-emitting element block located in the middle portion to consume less power than each of light-emitting elements located on opposite sides of the light-emitting element block located in the middle portion, the temperature is made uniform in the middle portion and in the side portions, and the temperature rise can be reduced.

The inventors then explored specific forms to adjust power consumption of each of the light-emitting element blocks in the middle portion and in the side portions.

As a result of the exploration, the inventors found a form of using light-emitting elements having different current-voltage characteristics in combination, a form of additionally including a light-emitting element connected in parallel to a plurality of light-emitting elements connected in series, a form of varying the number of light-emitting elements connected in series, and other forms, and eventually arrived at the present invention.

<Aspects of Invention>

A light-emitting module pertaining to one aspect of the present invention is a light-emitting module including a plurality of light-emitting element blocks two-dimensionally arranged on a substrate and connected in parallel, each of the light-emitting element blocks including a plurality of light-emitting elements connected in series, wherein the light-emitting element blocks are divided into: one or more light-emitting element blocks belonging to a first block group, located in a middle portion; and a plurality of light-emitting element blocks belonging to a second block group, located on opposite sides of the first block group, and one or more of the light-emitting element blocks belonging to the second block group each consume more power than each of the one or more light-emitting element blocks belonging to the first block group.

The "middle portion" refers to a middle portion of a mounting area where the light-emitting elements are two-dimensionally arranged. That is to say, in the mounting area, three or more light-emitting element blocks are arranged. The middle portion of the mounting area refers to an area where there are one or more light-emitting element blocks other than light-emitting element block located at both ends of the mounting area.

Specifically, the light-emitting element blocks are divided into the one or more light-emitting element blocks belonging to the "first block group" and the light-emitting element blocks belonging to the "second block group" as described below, for example.

When there are three light-emitting element blocks on the substrate, one light-emitting element block located in the middle portion belongs to the first block group, and the remaining two light-emitting element blocks belong to the second block group.

When there are four light-emitting element blocks on the substrate, two light-emitting element blocks located in the middle portion belong to the first block group, and the remaining two light-emitting element blocks belong to the second block group.

Alternatively, one of the two light-emitting element blocks located in the middle portion may belong to the first block group, and the remaining three light-emitting element blocks may belong to the second block group.

When there are five or more light-emitting element blocks on the substrate, one to three light-emitting element blocks located in and near the middle portion belong to the first block group, and the remaining light-emitting element blocks may belong to the second block group.

Alternatively, one light-emitting element block located in the middle portion and one of two light-emitting element blocks located on opposite sides of the light-emitting element block located in the middle portion may belong to the first block group, and the remaining three light-emitting element blocks may belong to the second block group.

That is to say, the one or more light-emitting element blocks belonging to the first block group and the light-emitting element blocks belonging to the second block group may not symmetrically be arranged, as long as the one or more light-emitting element blocks belonging to the first block group are located in and near the middle portion.

According to the above-mentioned aspect, since power consumption of each of the one or more light-emitting element blocks belonging to the first block group is set to be relatively low. Thus, the temperature is made uniform in the middle portion and in the side portions, and the temperature rise is reduced.

In the above-mentioned aspect, when power consumption of each of the one or more light-emitting element blocks belonging to the first block group is not less than 85% and not more than 97% of average power consumption of all the light-emitting element blocks included in the light-emitting module, a large effect of reducing the temperature rise can be obtained, and uneven luminance is less likely to be caused.

In order to obtain the effect of reducing the temperature rise as described above, it is preferable to set power consumption of each of the one or more light-emitting element blocks belonging to the first block group to no more than 95% of average power consumption of all the light-emitting element blocks.

The following are specific forms of setting power consumption of each of the one or more light-emitting element blocks belonging to the first block group to be lower than power consumption of each of the one or more of the light-emitting element blocks belonging to the second block group.

1. A form of including, as the light-emitting elements mounted on the substrate, a first semiconductor light-emitting element and a second semiconductor light-emitting element having current-voltage characteristics such that a current flowing through the second semiconductor light-emitting element becomes equal to a current flowing through the first semiconductor light-emitting element when a voltage that is lower than a voltage applied to the first semiconductor light-emitting element is applied to the second semiconductor light-emitting element. The one or more of the light-emitting element blocks belonging to the second block group are set to include a greater number of second semiconductor light-emitting elements than each of the one or more light-emitting element blocks belonging to the first block group.

When the light-emitting element blocks are connected in parallel, voltages applied across the respective light-emitting element blocks become equal. The number of light-emitting elements connected in series in each of the light-emitting element blocks is basically set to be the same. In this case, since voltages applied across the respective light-emitting element blocks become equal, an operating current flowing through each of the one or more of the light-emitting element blocks belonging to the second block group, which includes a greater number of second semiconductor light-emitting elements having a lower operating voltage than the first semiconductor light-emitting elements, becomes larger than an operating current flowing through each of the one or more light-emitting element blocks belonging to the first block group. That is to say, the operating current flowing through each of the one or more of the light-emitting element blocks belonging to the second block group increases with increasing number of second semiconductor light-emitting elements included in the second block group. This is because the operating current increases with increasing operating voltage of each light-emitting element, and the operating voltage increases with increasing operating current flowing through each light-emitting element. Thus, since voltages applied across the respective light-emitting element blocks belonging to the first block group and the second block group are equal, the one or more light-emitting element blocks belonging to the first block group each consume less power than each of the one or more of the light-emitting element blocks belonging to the second block group.

As the first semiconductor light-emitting element, a semiconductor light-emitting element emitting light of a shorter wavelength than light emitted from the second semiconductor light-emitting element may be selected. For example, the first semiconductor light-emitting element may be an element emitting blue light, and the second semiconductor light-emitting element may be an element emitting red light.

As the second semiconductor light-emitting element, a light-emitting element that is larger in size than the first semiconductor light-emitting element may be used.

2. A form of additionally including, in each of the one or more of the light-emitting element blocks belonging to the second block group, one or more light-emitting elements connected in parallel to a plurality of light-emitting elements connected in series.

In this case, the number of light-emitting elements connected in series in each of the light-emitting element blocks is also basically set to be the same. When one or more semiconductor light-emitting elements connected in parallel to the light-emitting elements are additionally included, an operating voltage of the remaining semiconductor light-emitting elements increases. Thus, in each of the one or more of the light-emitting element blocks belonging to the second block group and additionally including the one or more light-emitting elements connected in parallel, a flowing current and power consumption increase. The power consumption of each of the one or more light-emitting element blocks belonging to the first block group becomes relatively low.

3. A form of setting the number of light-emitting elements connected in series in each of the one or more of the light-emitting element blocks belonging to the second block group to be smaller than the number of light-emitting elements connected in series in each of the one or more light-emitting element blocks belonging to the first block group.

In this case, in each light-emitting element block including a smaller number of light-emitting elements connected in series, an operating voltage of each light-emitting element becomes relatively high. Thus, in each of one or more of the light-emitting element blocks belonging to the second block group and including a smaller number of light-emitting elements connected in series, an operating current and power consumption increase. In each of the one or more light-emitting element blocks belonging to the first block group, power consumption becomes relatively low.

Power consumption of each of the one or more light-emitting element blocks belonging to the first block group can also be reduced by connecting a resistor to each of the one or more light-emitting element blocks belonging to the first block group. Connecting the resistor, however, results in power loss.

The temperature is generally likely to become high in a light-emitting module, wherein, in a region where all semiconductor light-emitting elements are arranged, the semiconductor light-emitting elements each occupy an average area of not more than 3.3 mm$^2$. Thus, a larger effect can be obtained by application of the above-mentioned aspects.

Application of the above-mentioned aspects is particularly effective in a light-emitting module having a light-emitting element-mounting area of not less than 20 mm (vertical size)× not more than 50 mm (lateral size), or in a light-emitting module, wherein a total number of light-emitting elements arranged on the substrate is not less than 40 and not more than 520.

Heat is generally likely to accumulate in a light-emitting module in which a substrate includes a layer made of a ceramic material. The temperature, however, can be lowered by application of the above-mentioned aspects, and thus a larger effect can be obtained.

In each of the light-emitting modules having the above-mentioned aspects, the semiconductor light-emitting elements included in each of the light-emitting element blocks may electrically be connected by direct wire bonding.

<Embodiment>

[Embodiment 1]

The following describes a light-emitting module, a lamp unit, and a lighting device pertaining to Embodiment 1 with reference to the drawings.

<Lighting Device 1>

FIG. 1 is a sectional view of a lighting device 1 incorporating a light-emitting module 10 pertaining to an embodiment.

The lighting device 1 is a downlight embedded in the ceiling 2, and includes a fixture 3, a circuit unit 4, a dimming unit 5, and a lamp unit 6.

The fixture 3 is made of metal, and has a lamp housing 3a, a circuit housing 3b, and an outer flange 3c. The lamp housing 3a has a bottomed cylindrical shape. The lamp unit 6 is detachably mounted inside the lamp housing 3a. The circuit housing 3b extends from the bottom of the lamp housing 3a, and houses the circuit unit 4. The outer flange 3c is annular in shape, and extends outward from an aperture of the lamp housing 3a.

The fixture 3 is fixed to the ceiling 2 in a state where the lamp housing 3a and the circuit housing 3b are embedded in a hole 2a penetrating the ceiling 2, and the outer flange 3c is in contact with a part of a lower surface of the ceiling 2 surrounding the hole 2a.

The circuit unit 4 incorporates a circuit for lighting the lamp unit 6. The circuit unit 4 has a power wire 4a electrically connected to the lamp unit 6. A connector 4b is attached to the tip of the power wire 4a. The connector 4b is detachably connected to a connector 72 attached to lead wires 71 extending from the lamp unit 6.

Although the lamp unit 6 and the circuit unit 4 are included in the lighting device 1 as separate units, a circuit corresponding to the circuit unit 4 may be incorporated into the lamp unit 6.

<Lamp Unit 6>

Figure 2:
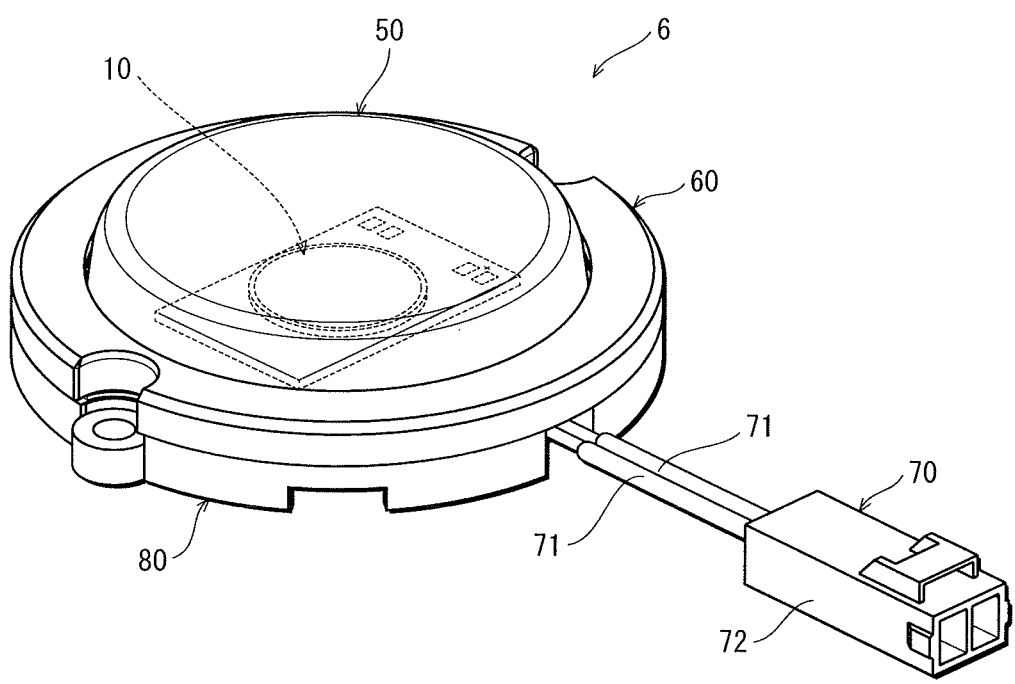
FIG. 2 is a perspective view of a lamp unit 6 included in the lighting device 1.
Figure 3:
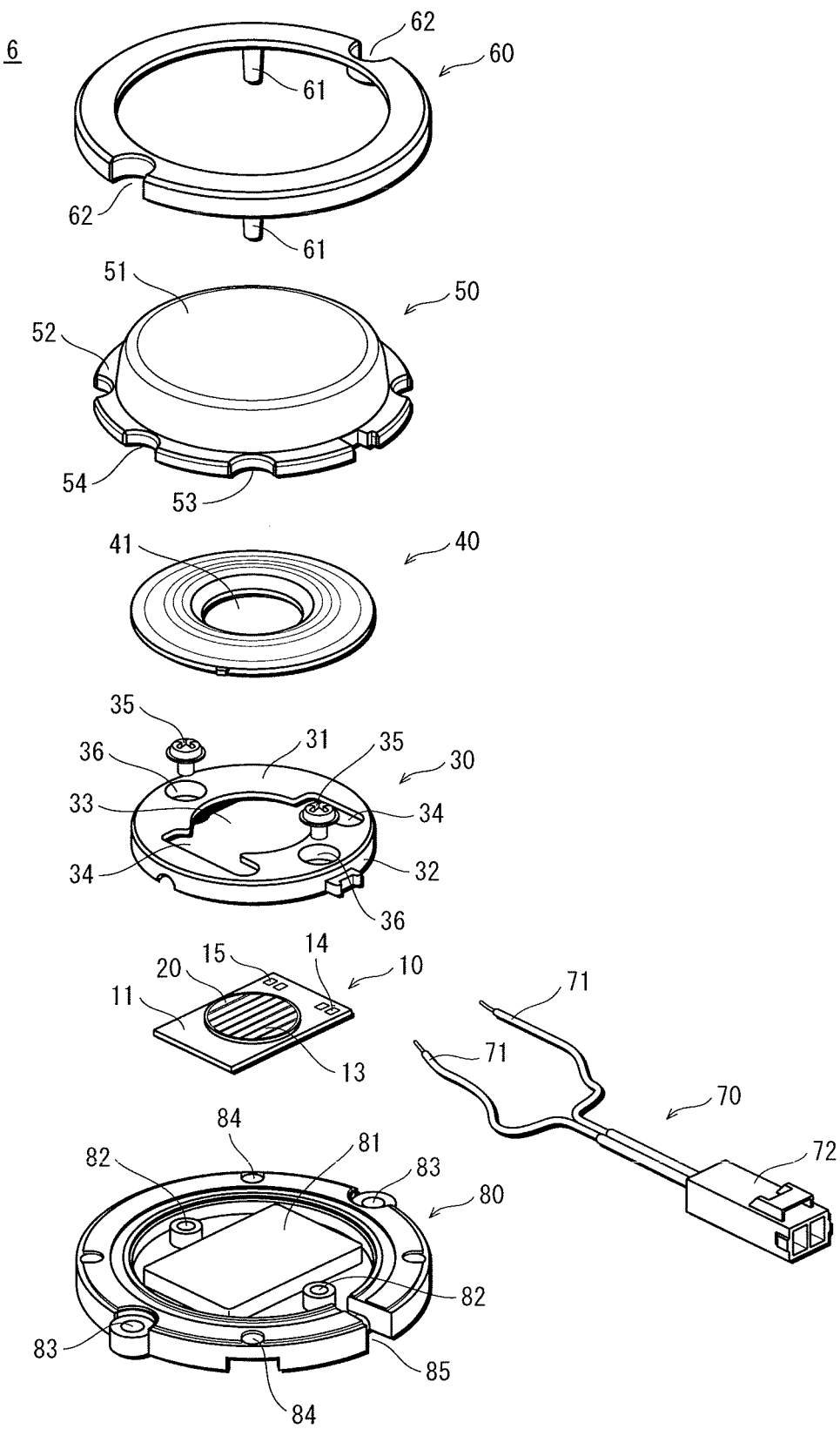
FIG. 3 is an exploded perspective view of the lamp unit 6.

FIG. 2 is a perspective view of the lamp unit 6, and FIG. 3 is an exploded perspective view of the lamp unit 6.

The lamp unit 6 incorporates the light-emitting module 10 as a light source, and includes a base 80, a holder 30, a dressed cover 40, a cover 50, a cover-pressing member 60, and a wiring member 70.

The base 80 is made of aluminum die cast, and has a disk-like shape. The base 80 has a mounting portion 81 in the center of an upper surface thereof. The light-emitting module 10 is mounted on the mounting portion 81. Screw holes 82 are provided in the upper surface of the base 80 so as to be opposite with the mounting portion 81 therebetween. The screw holes 82 receive assembly screws 35 for fixing the holder 30. In a peripheral portion of the base 80, through-holes 83, boss holes 84, and a cutout 85 are formed.

The holder 30 has a bottomed cylindrical shape. The holder 30 has a disk-shaped pressing plate 31, and a cylindrical peripheral wall 32 extending from the periphery of the pressing plate 31 toward the base 80 The light-emitting module 10 is fixed to the base 80 by being pressed against the mounting portion 81 by the pressing plate 31.

The pressing plate 31 has a window hole 33 allowing passage of light emitted from the light-emitting module 10 in its center. Apertures 34 for preventing the lead wires 71 connected to the light-emitting module 10 from interfering with the holder 30 are formed so as to communicate with the window hole 33. In a peripheral portion of the pressing plate 31 of the holder 30, through-holes 36 allowing insertion of assembly screws 35 are formed so as to correspond in position to the respective screw holes 82 in the base 80.

When the holder 30 is attached to the base 80, the base 80 and the holder 30 first sandwiches the light-emitting module 10 therebetween in a state where sealing members 13 and the like of the light-emitting module 10 are exposed from the window hole 33 in the holder 30. By then inserting the assembly screws 35 through the respective through-holes 36 from above the pressing plate 31 of the holder 30, and screwing the assembly screws 35 into the respective screw holes 82 in the base 80, the holder 30 is attached to the base 80.

The dressed cover 40 is made of a light non-transmissive material such as a white opaque resin, and is annular in shape. The dressed cover 40 is placed between the holder 30 and the cover 50 to cover and hide the lead wires 71 exposed from the apertures 34, the assembly screws 35, and the like. The dressed cover 40 has a window hole 41 in its center.

The cover 50 is formed of a light transmissive material such as a silicone resin, an acrylic resin, and glass. Light emitted from the sealing members 13 passes through the cover 50 to the outside of the lamp unit 6. The cover 50 has a dome-like shape. The cover 50 has a body 51 functioning as a lens, and an outer flange 52 extending outward from the periphery of the body 51 and fixed to the base 80.

The cover-pressing member 60 is made of a light non-transmissive material such as metal (e.g. aluminum) and a white opaque resin. The cover-pressing member 60 has an annular disk-like shape so as not to block light emitted from the body 51 of the cover 50. The outer flange 52 of the cover 50 is sandwiched and secured by the cover-pressing member 60 and the base 80.

On a lower surface of the cover-pressing member 60, columnar bosses 61 protruding toward the base 80 are provided. In the outer flange 52 of the cover 50, semicircular cutouts 53 are formed so as to correspond in position to the bosses 61. In the periphery of the base 80, the boss holes 84 allowing insertion of the respective bosses 61 are formed so as to correspond in position to the respective bosses 61.

When the cover-pressing member 60 is fixed to the base 80, the bosses 61 of the cover-pressing member 60 are inserted through the boss holes 84 in the base 80, and the tips of the bosses 61 are plastically deformed by being irradiated with a laser from the lower surface of the base 80 so as not to escape from the boss holes 84. The cover-pressing member 60 is thus fixed to the base 80.

In the periphery of the outer flange 52 of the cover 50 and in the periphery of the cover-pressing member 60, semicircular cutouts 54 and semicircular cutouts 62 are respectively formed so as to correspond in position to the through-holes 83 in the base 80 to prevent screws (not illustrated) passing through the through-holes 83 from coming into contact with the cover-pressing member 60 and the cover 50.

The wiring member 70 has a pair of lead wires 71 electrically connected to the light-emitting module 10. The lead wires 71 are guided to the outside of the lamp unit 6 via the cutouts 85 in the base 80, and connected to the connector 72 at respective ends.

<Light-Emitting Module 10>

Figure 4:
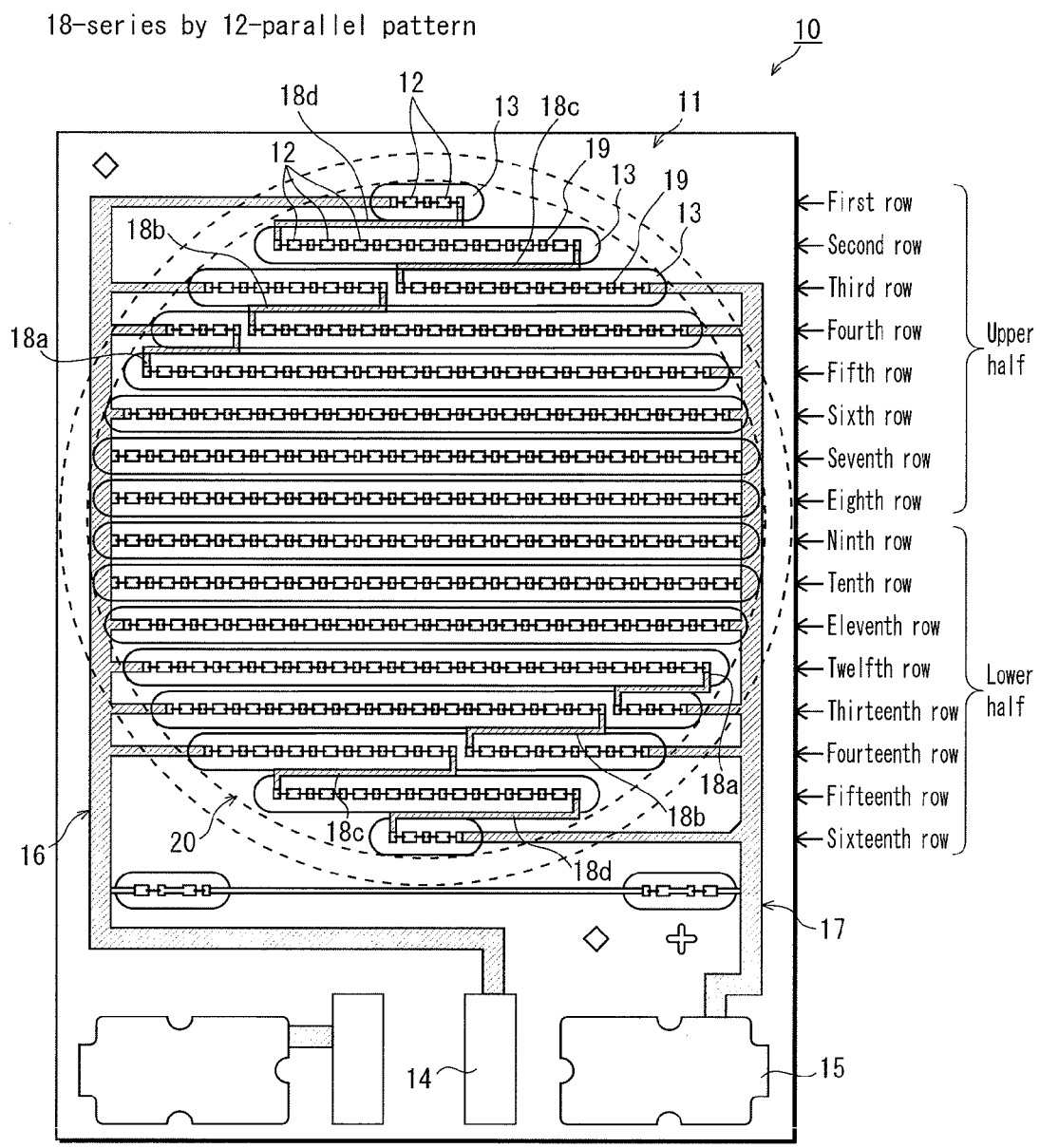
FIG. 4 is a plan view showing one example of the light-emitting module 10.

FIG. 4 is a plan view showing one example of the light-emitting module 10. The vertical direction and the lateral direction in FIG. 4 are also used as the "vertical direction" and the "lateral direction" in the rest of the description.

As illustrated in FIG. 4, the light-emitting module 10 includes a substrate 11, a plurality of light-emitting elements 12 arranged on the substrate 11, sealing members 13 each covering light-emitting elements 12 in a corresponding one of rows, terminals 14 and 15, and wires 16 and 17.

As illustrated in FIG. 4, the light-emitting elements 12 are two-dimensionally mounted in a mounting area 20 on an upper surface of the substrate 11. This means that, in the mounting area 20, the light-emitting elements 12 are mounted such that a plurality of rows of light-emitting elements are arranged in parallel. The mounting area corresponds to the light-emitting area.

In the light-emitting module 10 as illustrated in FIG. 4, 16 rows of light-emitting elements (i.e. the first to the sixteenth rows) are arranged at equal intervals in the vertical direction. The number of light-emitting elements 12 in each row and the length of each low decrease with increasing distance from the middle portion of the mounting area (with decreasing distance to both ends of the mounting area along the vertical direction). The mounting area 20 is shown as an area enclosed by a dashed line, and is circular in shape.

A total of 216 light-emitting elements 12 are arranged in the mounting area 20.

In the upper half of the mounting area 20, the numbers of light-emitting elements 12 in the first row, which is at an upper end, through the eighth row, which is in the middle portion, are set to be 2, 9, 12, 15, 16, 18, 18, 18, respectively. In the lower half of the mounting area 20, the numbers of light-emitting elements 12 in the sixteenth row, which is at a lower end, through the ninth row, which is in the middle portion are set to be the same as in the upper half of the mounting area 20. The light-emitting elements 12 are arranged in point symmetry (180° rotational symmetry).

The mounting area 20 has a diameter of 20 mm to 50 mm.

Substrate 11:

The substrate 11 has an insulating layer made of an insulating material such as a ceramic and a heat-conduction resin. The substrate 11 as a whole may be an insulating layer, or the substrate 11 may have a multi-layer structure including an insulating layer and a metal layer formed from an aluminum plate.

The shape of the substrate 11 is not particularly limited. The substrate 11 is herein a rectangular plate.

Light-Emitting Elements 12:

The light-emitting elements 12 are each a GaN LED chip emitting blue light having a dominant wavelength of approximately 430 nm to 470 nm, for example. The light-emitting elements 12 are mounted on the upper surface of the substrate 11 by using Chip-on-board (COB) technology.

The light-emitting elements 12 are each a 390 μm×520 μm rectangle or a 346 μm square, for example.

Each light-emitting element 12 and the light-emitting module 10 are herein an LED and an LED module, respectively. Each light-emitting element 12, however, may be a laser diode (LD) and an electroluminescence (EL) element.

Sealing Members 13:

The sealing members 13 linearly extending in the lateral direction are provided so as to cover a plurality of light-emitting elements 12 in respective rows. The sealing members 13 are each formed of a light transmissive material containing a wavelength conversion material. The sealing members 13 each convert part of light emitted from the light-emitting elements 12 into light having a different wavelength. The sealing members 13 also seal the light-emitting elements 12.

As the wavelength conversion material, phosphor particles can be used. As the light transmissive material, a silicone resin, a fluororesin, a silicone-epoxy hybrid resin, a urea resin can be used, for example.

The blue light emitted from the light-emitting elements 12 and having a dominant wavelength of approximately 430 nm to 470 nm is partially converted into light having a dominant wavelength of approximately 540 nm to 640 nm by the wavelength conversion materials contained in the sealing members 13. As a result, the light resulting from the wavelength conversion and the blue light before the wavelength conversion are mixed to become white light.

Color of light emitted from phosphors for use in the sealing members 13 may vary for each row of light-emitting elements. For example, the color may be green, yellow, and the like. The color temperature of overall white light can thus be adjusted to be in a range of 2700° C. to 6500° C., for example.

Although the efficiency of extracting light from the light-emitting elements 12 is improved by using the sealing members 13 linearly extending for each row of light-emitting elements as described above, all the light-emitting elements 12 mounted in the mounting area 20 may collectively be covered with a single sealing member.

Terminals, Wires, Lands:

The terminals 14 and 15, and wires 16 and 17 are a conductive pattern formed on the insulating layer of the substrate 11. The terminals 14 and 15 feed power to the light-emitting elements 12, and are formed in the periphery on the upper surface of the substrate 11 as illustrated in FIG. 4. The terminals 14 and 15 are electrically connected to the lead wires 71 as illustrated in FIGS. 1-3.

In the mounting area 20, lands 19 for bonding are provided adjacent to the respective light-emitting elements 12 on the substrate 11. The light-emitting elements 12 and the lands 19 are electrically connected by wire bonding. Any two light-emitting elements 12 adjacent to each other in the lateral direction are directly connected by a corresponding one of the land 19. Furthermore, in the mounting area 20, wires 18a-18d are provided across adjacent rows of light-emitting elements.

Figure 5:
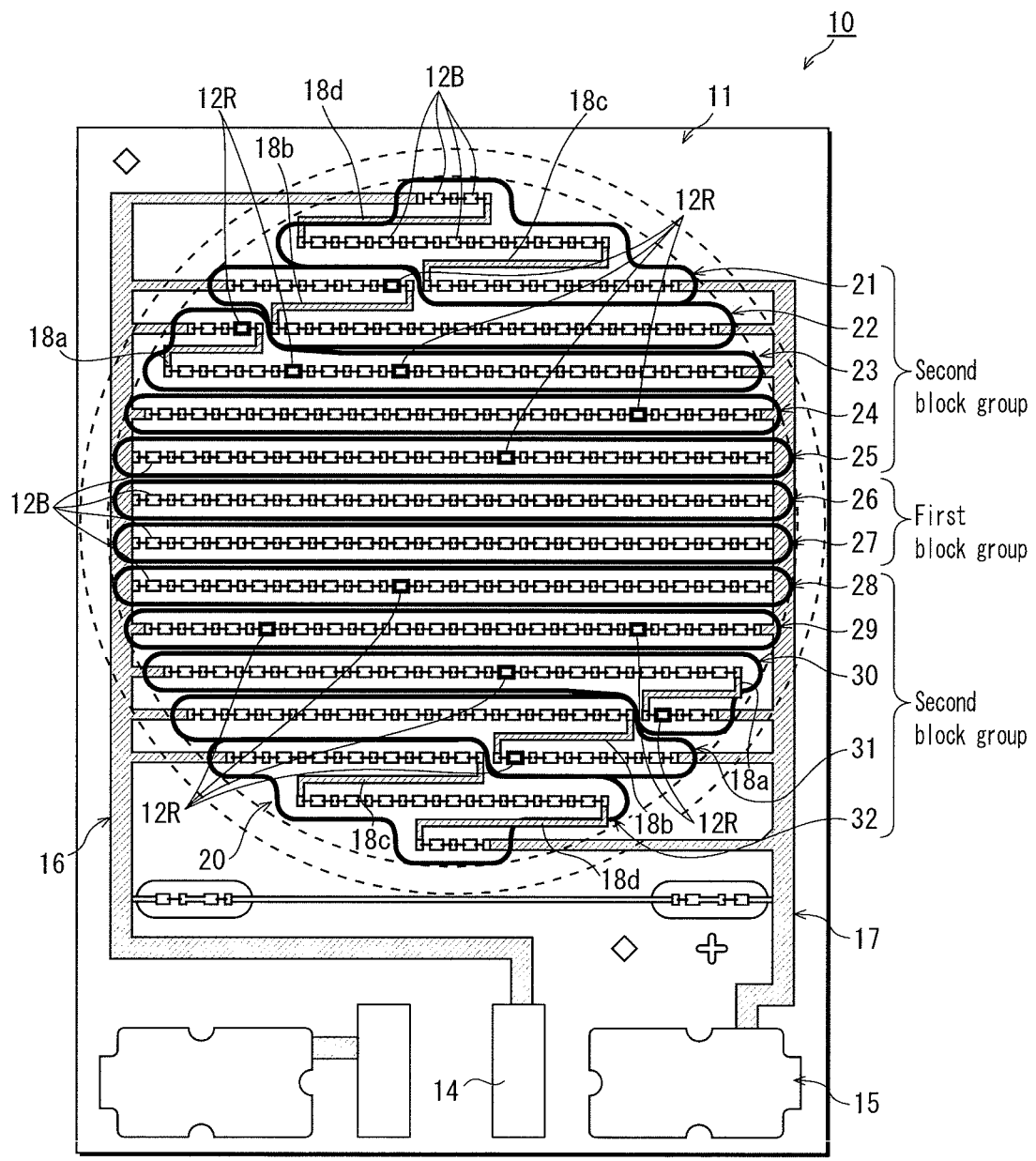
FIG. 5 is a plan view showing light-emitting element blocks 21-32 in the light-emitting module 10.

FIG. 5 shows light-emitting element blocks 21-32.

The light-emitting elements 12 mounted in the mounting area 20 are divided into 12 light-emitting element blocks 21-32 by the wires 18a-18d and the lands 19. In FIG. 5, the light-emitting element blocks 21-32 are shown by frames in thick lines. In each of the light-emitting element blocks 21-32, 18 light-emitting elements 12 are connected in series.

The wire 16 electrically connects respective first ends of the light-emitting element blocks 21-32 to the terminal 14. The wire 17 electrically connects respective second ends of the light-emitting element blocks 21-32 to the terminal 15. The light-emitting element blocks 21-32 are connected in parallel by the wires 16 and 17, and the light-emitting elements 12 as a whole are connected in an 18-series by 12-parallel pattern.

In the present embodiment, the light-emitting elements 12 are electrically connected by wires via the lands 19. The light-emitting elements 12, however, may be directly electrically connected by wires not via the lands 19. In this case, the light-emitting elements 12 can be mounted on the substrate without being restricted by the positions of the lands 19. In addition, a light absorption loss caused by the lands 19 does not occur.

Circuit Unit 4:

The circuit unit 4 includes a circuit having an AC/DC converter. The circuit unit 4 is electrically connected to an external commercial AC power supply (not illustrated). The circuit unit 4 converts power input from the commercial AC power supply into a DC voltage suitable for the rows of light-emitting elements 12, and supplies the resulting voltage. Lighting of all the light-emitting elements 12 is thus collectively controlled.

(Features and Effects of Light-emitting Module 10)

As described above, in the mounting area 20, 12 light-emitting element blocks 21-32 each including a plurality of (18) light-emitting elements 12 connected in series are arranged in parallel by the wires 16 and 17.

The light-emitting elements 12 included in each of the light-emitting element blocks 26 and 27 that are located in the middle portion are all blue light-emitting elements 12B. On the other hand, the light-emitting element blocks 21-25 that are located above the light-emitting element blocks 26 and 27, and the light-emitting element blocks 28-32 that are located below the light-emitting element blocks 26 and 27 include one or more light-emitting element blocks each including not only the blue light-emitting elements 12B but also one or more red light-emitting elements 12R. The light-emitting element blocks 26 and 27 belong to a first block group, and the other light-emitting element blocks 21-25 and 28-32 belong to a second block group.

A light-emitting element emitting light of a shorter wavelength typically has a higher operating voltage. This is because the wavelength of light depends on an energy level of a light-emitting layer included in the light-emitting element. For example, a blue light-emitting element has an operating voltage of approximately 3 V, and a red light-emitting element has an operating voltage of approximately 2 V. That is to say, the red light-emitting element 12R has VF-IF characteristics such that a current flowing through the red light-emitting element 12R becomes equal to a current flowing through the blue light-emitting element 12B when a voltage that is lower than a voltage applied to the blue light-emitting element 12B is applied to the red light-emitting element 12R.

Voltages applied across the respective light-emitting element blocks 21-32 connected in parallel become equal. The number of light-emitting elements connected in series in each of the light-emitting element blocks 21-32 is the same. An operating current flowing through each of one or more of the light-emitting element blocks 21-25 and 28-32 belonging to the second block group, which includes the red light-emitting elements 12R having a lower operating voltage than the blue light-emitting elements 12B, becomes larger than an operating current flowing through each of the light-emitting element blocks 26 and 27 belonging to the first block group. That is to say, an operating current flowing through the second block group increases with increasing number of red light-emitting elements 12R included in the second block group. This is because the operating current increases with increasing operating voltage of each light-emitting element, and the operating voltage increases with increasing operating current flowing through each light-emitting element. Thus, since voltages applied across the respective first and second block groups are equal, the first block group, through which a smaller operating current flows than the second block group, consumes less power than the second block group. Since voltages applied across the respective first and second block groups are equal, each of the light-emitting element blocks 26 and 27 belonging to the first block group, through which a smaller operating current flows than each of the one or more of the light-emitting element blocks 21-25 and 28-32 belonging to the second block group, consumes less power than each of the one or more of the light-emitting element blocks 21-25 and 28-32 belonging to the second block group.

The effect of reducing the temperature is thus expected. Meanwhile, power consumption and light-emitting luminance of one or more light-emitting element blocks including a great number of red light-emitting elements 12R can increase. This can result in uneven light emission.

In view of these aspects, the number of red light-emitting elements 12R mixed into the light-emitting element blocks 21-25 and 28-32 is set so that power consumption of each of the light-emitting element blocks 26 and 27 is 85% to 97% of average power consumption of all the light-emitting element blocks.

It is also preferable to mount the red light-emitting elements 12R at distributed locations in the second block group.

The light-emitting module 10 has a better color rendering than a light-emitting module including only blue light-emitting elements 12B, as the light-emitting module 10 includes one or more red light-emitting elements 12R.

(Working Example and Comparative Testing)

The following describes the present invention in detail based on a working example and a comparative example.

The working example is shown in FIG. 5. Out of 216 light-emitting elements 12 being mounted, 12 light-emitting elements 12 are red light-emitting elements 12R, and the other light-emitting elements 12 are all blue light-emitting elements 12B. The size (chip size) of each of the light-emitting elements 12 is fixed.

On the other hand, in the comparative example, a light-emitting module in which 216 light-emitting elements are all blue light-emitting elements 12B is used. The light-emitting module in the comparative example is similar to that in the working example shown in FIG. 5, except that all the light-emitting elements are blue light-emitting elements.

In the working example, in the second block group in the mounting area 20, the red light-emitting elements 12R are mounted so as to be distributed in point symmetry (180° rotational symmetry) with respect to the center of the mounting area 20.

In each of the light-emitting element blocks 26 and 27 located in the middle portion, only the blue light-emitting elements 12B are connected in series and mounted. In each of the light-emitting element blocks 22-25 and 28-31 located on opposite sides of the light-emitting element blocks 26 and 27 located in the middle portion, most of light-emitting elements connected in series are blue light-emitting elements 12B, but one or more red light-emitting elements 12R are mixed. Specifically, in each of the light-emitting element blocks 22, 24, 25, 28, and 31, one red light-emitting element 12R is mixed, and, in each of the light-emitting element blocks 29 and 30, two red light-emitting elements 12R are mixed.

Figure 6A:
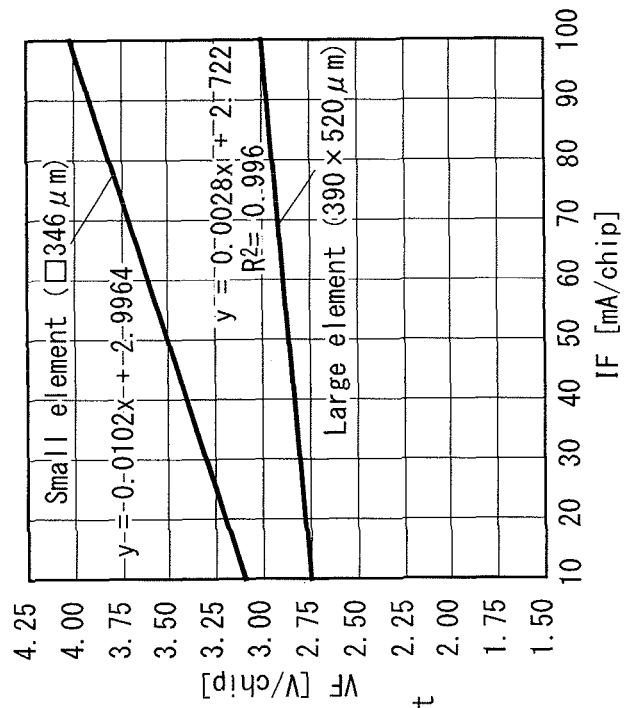
FIG. 6A shows current VI-voltage VF characteristics of a red light-emitting element 12R and a blue light-emitting element 12B.

FIG. 6A shows current VI-voltage VF characteristics of the red light-emitting element 12R and the blue light-emitting element 12B. As shown in FIG. 6A, the red light-emitting element 12R has VF-IF characteristics such that an operating current flowing through the red light-emitting element 12R becomes equal to an operating current flowing through the blue light-emitting element 12B when an operating voltage that is lower than an operating voltage applied to the blue light-emitting element 12B is applied to the red light-emitting element 12R.

In the comparative example, all the light-emitting elements 12 are blue light-emitting elements 12B. In this case, power consumption of each of the light-emitting element blocks is equal, and thus the temperature is likely to increase in the middle portion as heat is less likely to dissipate in the middle portion.

In contrast, in the light-emitting module 10 in the working example, power consumption of each of one or more light-emitting element blocks located in the middle portion is relatively low, and thus the temperature rise in the middle portion is suppressed as described below.

Comparative Testing:

Temperature measurement was performed in each of the working example and the comparative example by setting the total input power in each of the examples to 37.2 W.

In the working example, a voltage applied across each of the light-emitting element blocks is 62 V, and an average current flowing through the light-emitting element blocks is 50 mA.

In each of the light-emitting element blocks 26 and 27 located in the middle portion, a voltage applied across each of the light-emitting elements 12B is 3.45 V. In each of the light-emitting element blocks 22, 24, 25, 28, and 31, a voltage applied across each of the red light-emitting elements 12R is 2.35 V, and a voltage applied across each of the blue light-emitting elements 12B is 3.51 V. In each of the light-emitting element blocks 29 and 30, a voltage applied across each of the red light-emitting elements 12R is 2.40 V, and a voltage applied across each of the blue light-emitting elements 12B is 3.57 V.

A current flowing through each of the light-emitting element blocks, and power consumption and a power consumption ratio of each of the light-emitting element blocks are as shown in FIG. 10A.

The power consumption ratio is a ratio of power consumption of each block to an average power consumption of all the blocks. For example, since the average power consumption is 3.1 W, and the power consumption of the light-emitting element block 21 is 2.7 W, the ratio as standardized is 87%.

Figure 7A:
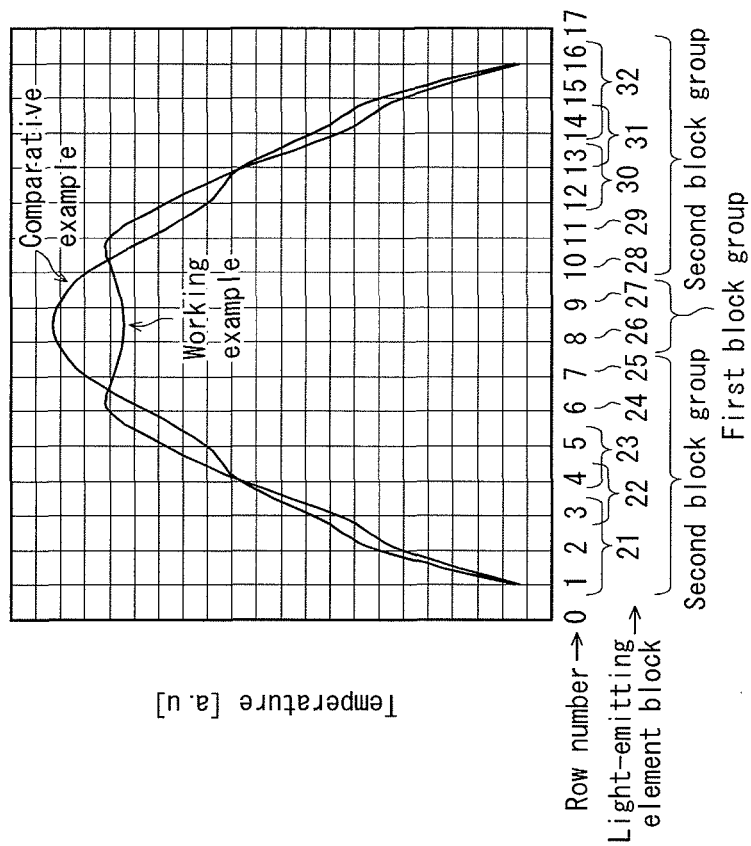
FIG. 7A is a graph showing power consumption for each row of light-emitting elements.
Figure 7B:
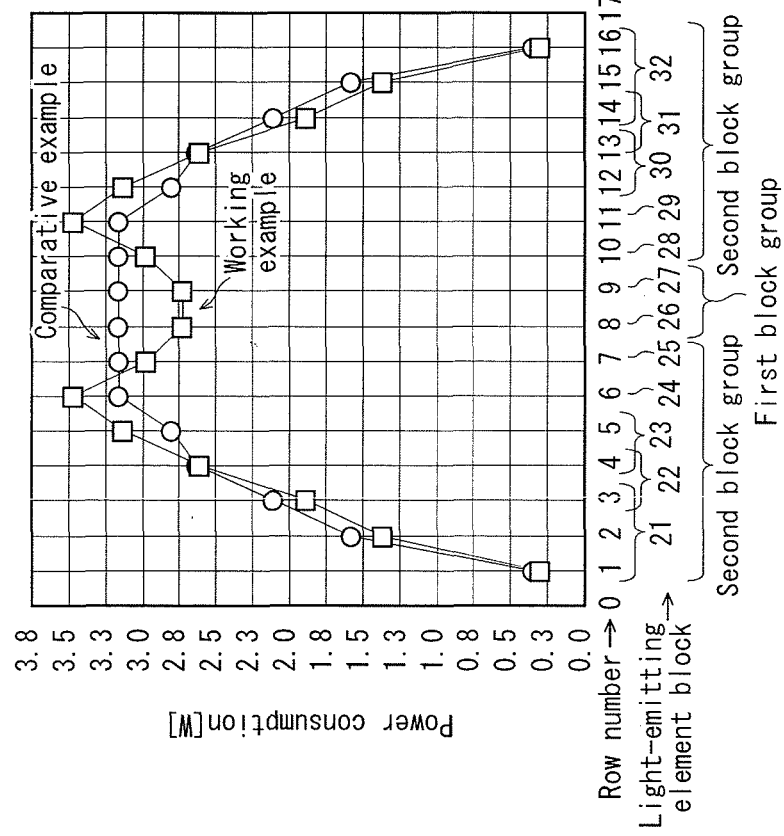
FIG. 7B is a graph showing temperature distribution in rows of light-emitting elements.

FIG. 7A is a graph showing power consumption of each of rows (the first to the sixteenth rows) of light-emitting elements. FIG. 7B is a graph showing temperature distribution of respective rows (the first to the sixteenth rows) of light-emitting elements, and shows the temperature in a middle portion of each of the rows of light-emitting elements in the lateral direction.

As shown in FIG. 7B, in both of the working example and the comparative example, the temperature tends to be high in and near the middle portion. The temperature, however, is particularly high in the middle portion in the comparative example, whereas the temperature rise in the middle portion is reduced in the working example. This means that, in the comparative example, there is a great difference in temperature between the middle portion and the side portions of the mounting area, whereas the working example exhibits an even temperature distribution.

By having the even temperature distribution, warpage of the substrate 11 is suppressed. The warpage of the substrate can typically cause breakage and decreased adhesion to a fixture, which can reduce heat dissipation toward the fixture.

The even temperature distribution exhibited in the working example may be due to the fact that the first block group located in the middle portion consumes less power than the second block group in the working example, whereas power consumption of each of the light-emitting element blocks is equal in the comparative example.

(Consideration)

The effects of the light-emitting module 10 were further considered as described below.

1. In the light-emitting module 10, since the substrate 11 includes a layer made of a ceramic material, heat generated by the light-emitting elements 12 is less likely to dissipate in a direction along a surface of the substrate 11. In such a case, it is generally likely that heat accumulates and the temperature becomes high. In the light-emitting module 10, however, the temperature rise can be suppressed.

The present invention is thus particularly effective in a case where the substrate 11 includes the layer made of a ceramic material as with the light-emitting module 10.

2. In examination of a relation between the mounting density of the light-emitting elements and the temperature rise in the light-emitting module, the temperature is generally less likely to increase when the mounting density is low (when the light-emitting elements each occupy an average area of more than 3.3 mm$^2$). It was also found that the temperature is likely to increase when the mounting density is high (when the light-emitting elements each occupy an average area of not more than 3.3 mm$^2$).

Accordingly, when the light-emitting elements each occupy an average area of not more than 3.3 mm$^2$, a large temperature reducing effect can be obtained by the light-emitting module 10.

3. In the light-emitting module 10, when the total number of light-emitting elements 12 mounted in the mounting area 20 is in a range of 40 to 520, the number of rows of light-emitting elements mounted in the mounting area 20 is in a range of 3 to 25, and the total input power is in a range of 10 W to 100 W, a favorable temperature reducing effect can also be obtained.

4. In the light-emitting module 10, the number of light-emitting elements 12 included in each row of light-emitting elements located at both ends of the mounting area 20 is smaller than the number of light-emitting elements 12 included in each row of light-emitting elements located in the middle portion of the mounting area 20, and the mounting area 20 is circular in shape. The shape of the mounting area 20, however, is not particularly limited. For example, the present invention can be implemented when the mounting area 20 is rectangular in shape as described below, and a similar effect can be obtained.

(Example in which Mounting Area 20 is Rectangular in Shape)

Figure 8:
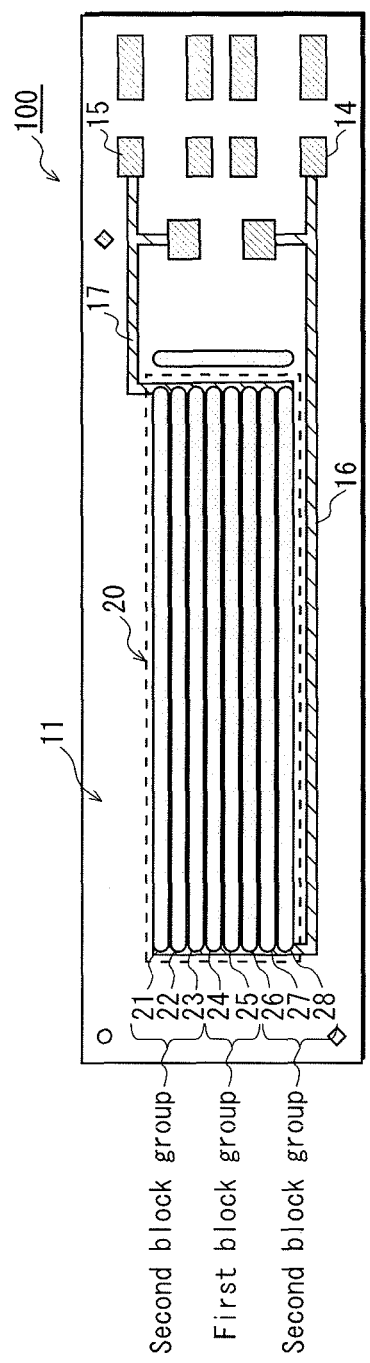
FIG. 8 illustrates a light-emitting module 100 having a rectangular mounting area.

FIG. 8 illustrates a light-emitting module 100 having a rectangular mounting area.

The light-emitting module 100 has a similar structure to the light-emitting module 10, except that the mounting area 20 is rectangular in shape. In FIG. 8, components similar to those of the light-emitting module 10 are assigned with the same reference signs.

In the light-emitting module 100, eight rows of light-emitting elements each having approximately the same length are mounted in the mounting area 20. The eight rows of light-emitting elements correspond to the light-emitting element blocks. Each of the light-emitting element blocks includes a plurality of (e.g. 36) light-emitting elements 12 connected in series.

That is to say, eight light-emitting element blocks 21 to 28 are connected in parallel, and the light-emitting elements are connected in a 36-series by 8-parallel pattern.

Each of the light-emitting element blocks 24 and 25 (belonging to the first block group) located in the middle portion includes only blue light-emitting elements 12G. On the other hand, one or more of the light-emitting element blocks 21-23 and 26-28 (belonging to the second block group) located on opposite sides of the first block group include one or more red light-emitting elements 12R mixed into and connected in series to blue light-emitting elements 12B. As described with respect to the light-emitting module 10, power consumption of each of the blocks belonging to the first block group is set to be 85% to 97% of an average power consumption of all the blocks.

For example, from among 36 light-emitting elements 12 connected in series in each of the light-emitting element blocks 22, 23, 26, and 27, two to four light-emitting elements are red light-emitting elements 12R mounted so as to be distributed, and the other light-emitting elements are blue light-emitting elements 12B.

With this structure, as described with respect to the light-emitting module 10, each of the light-emitting element blocks 24 and 25 (the first block group) located in the middle portion consumes less power than each of the light-emitting element blocks 21-23 and 26-28 (the second block group), and the temperature rise in the middle portion of the mounting area can thus be reduced.

(Modifications of Embodiment 1)

In Embodiment 1, each of the one or more light-emitting element blocks belonging to the first block group includes only blue light-emitting elements 12B. Each of the one or more light-emitting element blocks belonging to the first block group, however, may include one or more red light-emitting elements 12R. In this case, each of one or more of the light-emitting element blocks belonging to the second block group is set to include a greater number of red light-emitting elements 12R than each of the one or more light-emitting element blocks belonging to the first block group, so that each of the one or more of the light-emitting element blocks belonging to the second block group consumes more power than each of the one or more light-emitting element blocks belonging to the first block group.

The combination of colors of light emitted from the light-emitting elements is not limited to blue and red. By using light-emitting elements emitting light of different wavelengths in combination, and by setting the number of light-emitting elements emitting light of different wavelengths such that each of the one or more of the light-emitting element blocks belonging to the second block group includes a greater number of light-emitting elements emitting light of a longer wavelength than each of the one or more light-emitting element blocks belonging to the first block group, the temperature rise can be suppressed in a similar manner. Each of the light-emitting elements may be a light-emitting element emitting ultraviolet light or infrared light. The number of colors of emitted light is also not limited to two, and light-emitting elements emitting light of three or more colors may be used in combination.

[Embodiment 2]

In a light-emitting module 110 in the present embodiment, a small light-emitting element and a large light-emitting element are used. One or more of the light-emitting element blocks belonging to the second block group located on opposite sides of the middle portion each include a greater number of large light-emitting elements than each of the one or more light-emitting element blocks belonging to the first block group located in the middle portion.

With this structure, each of the one or more blocks belonging to the first block group located in the middle portion consumes less power than each of the one or more of the blocks belonging to the second block group, as in Embodiment 1 described above.

As described in Embodiment 1, the power consumption of each of the light-emitting element blocks belonging to the first block group is set to be 85% to 97% of an average power consumption of all the light-emitting element blocks.

In the light-emitting module 110, the temperature rise is reduced in a similar reason to Embodiment 1.

(Working Example)

FIG. 9A shows a working example of the light-emitting module 110, and shows a mounting area of the light-emitting module 110.

As in the light-emitting module 100 illustrated in FIG. 8, in the light-emitting module 110, eight light-emitting element blocks 21-28 are connected in parallel. However, the number of light-emitting elements 12 connected in series in each of the light-emitting element blocks is 15, and the light-emitting elements 12 are connected in a 15-series by 8-parallel pattern.

Four light-emitting elements indicated as "large size" in FIG. 9A are large light-emitting elements, and the other light-emitting elements 12 are small light-emitting elements.

In each of the light-emitting element blocks 24 and 25 (belonging to the first block group) located in the middle portion, only small light-emitting elements 12 are used. On the other hand, from among the light-emitting element blocks 21-23 and 26-28 (belonging to the second block group) located on opposite sides of the light-emitting element blocks 24 and 25 located in the middle portion, in each of the light-emitting element blocks 21, 23, 26, and 28, a small light-emitting element 12 and a large light-emitting element 12 are mixed.

The small light-emitting elements 12 are each a 346 μm square, and the large light-emitting elements 12 are each a 390 μm×520 μm rectangle.

Figure 6B:
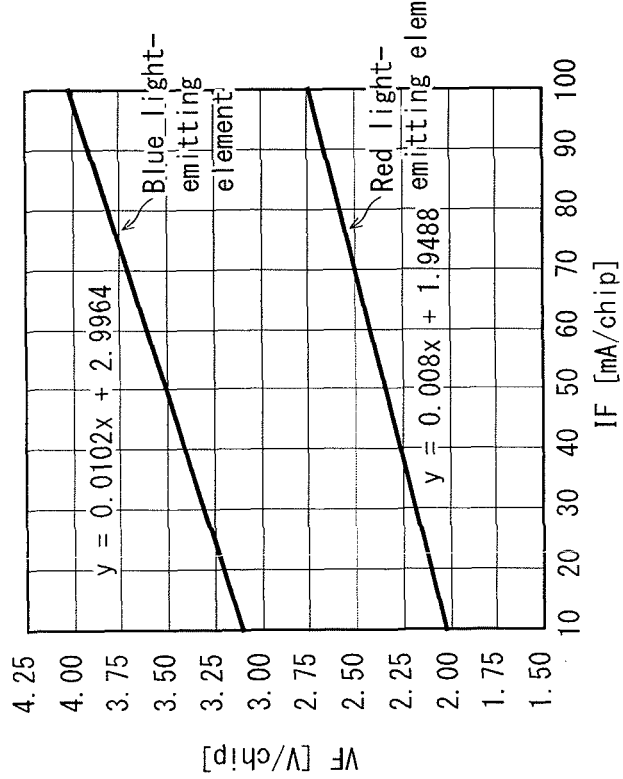
FIG. 6B shows current VI-voltage VF characteristics of a large light-emitting element 12 and a small light-emitting element 12.

FIG. 6B shows current VI-voltage VF characteristics of the large light-emitting element 12 and the small light-emitting element 12. As shown in FIG. 6B, the large light-emitting element 12 has VF-IF characteristics such that an operating current flowing through the large light-emitting element 12 becomes equal to an operating current flowing through the small light-emitting element 12 when an operating voltage that is lower than an operating voltage applied to the small light-emitting element 12 is applied to the large light-emitting element 12.

Since the light-emitting element blocks 21-28 are connected in parallel, voltages applied across the respective light-emitting element blocks 21-28 become equal. The number of light-emitting elements connected in series in each of the light-emitting element blocks is set to be the same.

Since the voltages applied across the respective light-emitting element blocks become equal, an operating current flowing through each light-emitting element block that includes a greater number of large light-emitting elements, which each have a lower operating voltage than a small light-emitting element, becomes relatively large. That is to say, the operating current flowing through each block increases with increasing number of large light-emitting elements included in the block. This is because the operating current increases with increasing operating voltage of the light-emitting element, and the operating voltage increases with increasing operating current. Power consumption of each light-emitting element block including one or more large light-emitting elements also becomes relatively high.

Each of the light-emitting element blocks 24 and 26 (belonging to the first block group) including only small light-emitting elements consumes less power than each of one or more of the light-emitting element blocks 21-23 and 26-28 (belonging to the second block group) including one or more large light-emitting elements.

Assume that the light-emitting module 110 pertaining to the working example is driven by 52.1 V.

In this case, in each of the light-emitting element blocks 22, 24, 25, and 27, a voltage applied across each of the light-emitting elements 12 is 3.49 V. In each of the light-emitting element blocks 21, 23, 26, and 28, a voltage applied across each of the large light-emitting elements 12 is 2.88 V, and a voltage applied across each of the small light-emitting elements 12 is 3.53 V.

The current flowing through each of the light-emitting element blocks, and the power consumption and the power consumption ratio of each of the light-emitting element blocks are as shown in FIG. 10B. An average current flowing through the blocks is 50 mA.

A ratio (power consumption ratio) of power consumption of each of the light-emitting element blocks 24 and 25 located in the middle portion to an average power consumption of all the blocks is 94%.

The temperature rise in the light-emitting module 110 is reduced as in the light-emitting module 100 described in Embodiment 1.

(Modifications of Embodiment 2)

In Embodiment 2, each of the one or more light-emitting element blocks belonging to the first block group includes only small light-emitting elements 12. Each of the one or more light-emitting element blocks belonging to the first block group, however, may include one or more large light-emitting elements 12. In this case, each of one or more of the light-emitting element blocks belonging to the second block group is set to include a greater number of large light-emitting elements 12 than each of the one or more light-emitting element blocks belonging to the first block group, so that each of the one or more of the light-emitting element blocks belonging to the second block group consumes more power than each of the one or more light-emitting element blocks belonging to the first block group.

[Embodiment 3]

In a light-emitting module 120 in the present embodiment, in each of one or more of the light-emitting element blocks belonging to the second block group, one or more light-emitting elements branching in parallel to the light-emitting elements 12 connected in series are additionally included. At locations where the one or more light-emitting elements branching in parallel are additionally included, an equal current flows with a lower voltage. Power consumption of the light-emitting element block in which the one or more light-emitting elements are additionally included thus becomes relatively high.

With this structure, in the light-emitting module 120, each of the one or more blocks belonging to the first block group located in the middle portion consumes less power than each of the one or more of the blocks belonging to the second block group located on opposite sides of the one or more blocks belonging to the first block group, as in Embodiments 1 and 2 described above.

As described in Embodiments 1 and 2, in the light-emitting module 120, power consumption of each of the one or more blocks belonging to the first block group is set to be 85% to 97% of an average power consumption of all the blocks.

(Working Example)

FIG. 9B shows a mounting area of the light-emitting module 120 pertaining to the working example. In the light-emitting module 120, rows of light-emitting elements (light-emitting element blocks 21-28) each having approximately the same length are arranged in the mounting area as in the light-emitting module 100 described above.

The light-emitting element blocks 21-28 each include a plurality of (15) light-emitting elements 12 connected in series. The eight light-emitting element blocks 21-28 are connected in parallel, and thus the light-emitting elements are connected in a 15-series by 8-parallel pattern.

In each of the light-emitting element blocks 24 and 25 (belonging to the first block group) located in the middle portion, 15 light-emitting elements 12 are simply connected in series.

On the other hand, in each of the light-emitting element blocks 22 and 23, and 26 and 27 (belonging to the second block group) respectively located above and below the light-emitting element blocks 24 and 25, 15 light-emitting elements 12 are connected in series, and, to some light-emitting elements 12a out of 15 light-emitting elements 12, light-emitting elements 12b are connected in parallel.

As illustrated in FIG. 9B, in the light-emitting element block 22, to four light-emitting elements 12a out of 15 light-emitting elements 12, light-emitting elements 12b are connected in parallel. Similarly, in the light-emitting element block 27, light-emitting elements 12b are connected in parallel to four light-emitting elements 12a. The total number of light-emitting elements included in each of the light-emitting element blocks 22 and 27 is thus 19.

In each of the light-emitting element blocks 23 and 26, to three light-emitting elements 12a out of 15 light-emitting elements 12, light-emitting elements 12b are connected in parallel. The total number of light-emitting elements included in each of the light-emitting element blocks 23 and 26 is thus 18.

Voltages applied across the respective light-emitting element blocks 21-28 connected in parallel become equal. The number of light-emitting elements connected in series in each of the light-emitting element blocks is set to 15. A current branches at a location where two light-emitting elements are connected in parallel. Compared to a location where light-emitting elements are connected in series, an operating current flowing through each of the light-emitting elements decreases, and an operating voltage of each of the light-emitting elements connected in parallel decreases. Since voltages applied across the respective light-emitting element blocks become equal, a current flowing through each of the light-emitting element blocks increase with increasing number of light-emitting elements connected in parallel. That is to say, each of the light-emitting element blocks 21, 24, 25, and 28, which includes no light-emitting element connected in parallel, consumes less power than each of the light-emitting element blocks 22, 23, 26, and 27, which includes light-emitting elements connected in parallel.

Assume that the light-emitting module 120 pertaining to the working example is driven by 52.1 V.

In this case, in each of the light-emitting element blocks 21, 24, 25, and 28, a voltage applied across each of the light-emitting elements 12 is 3.48 V.

On the other hand, in each of the light-emitting element blocks 23 and 26, there are three locations where the light-emitting elements 12a and 12b are connected in parallel. A voltage applied at the location where the light-emitting elements 12a and 12b are connected in parallel is 3.26 V, and a voltage applied at a location where the light-emitting elements 12a and 12b are not connected in parallel is 3.53 V. In each of the light-emitting element blocks 22 and 27, there are four locations where the light-emitting elements 12a and 12b are connected in parallel. A voltage applied at the location where the light-emitting elements 12a and 12b are connected in parallel is 3.27 V, and a voltage applied at a location where the light-emitting elements 12a and 12b are not connected in parallel is 3.55 V.

The current flowing through each of the light-emitting element blocks, and the power consumption and the power consumption ratio of each of the light-emitting element blocks are as shown in FIG. 10C. An average current flowing through the blocks is 50 mA.

As shown in FIG. 10C, in the light-emitting module 120, a current flowing through each of the light-emitting element blocks 24 and 25 (the first block group) located in the middle portion is smaller than a current flowing through each of the light-emitting element blocks 22, 23, 26, and 27 (the second block group). Each of the light-emitting element blocks 24 and 25 consumes less power than each of the light-emitting element blocks 22, 23, 26, and 27. The temperature rise in the middle portion is thus suppressed in the light-emitting module 120.

(Modifications of Embodiment 3)

In Embodiment 3, each of the one or more light-emitting element blocks belonging to the first block group includes only light-emitting elements 12 connected in series. Each of the one or more light-emitting element blocks belonging to the first block group, however, may include the light-emitting elements 12a and 12b connected in parallel.

In this case, each of one or more of the light-emitting element blocks belonging to the second block group is set to include a greater number of locations where the light-emitting elements 12a and 12b are connected in parallel than each of the one or more light-emitting element blocks belonging to the first block group, so that each of the one or more of the light-emitting element blocks belonging to the second block group consumes more power than each of the one or more light-emitting element blocks belonging to the first block group.

The number of light-emitting elements connected in parallel is also not limited to two. The number of light-emitting elements included in each of the light-emitting element blocks including locations where light-emitting elements are connected in parallel may not be greater than the number of light-emitting elements included in each of the light-emitting element blocks not including locations where light-emitting elements are connected in parallel, and may be equal to or smaller than the number of light-emitting elements included in each of the light-emitting element blocks not including locations where light-emitting elements are connected in parallel.

[Embodiment 4]

In a light-emitting module 130 in the present embodiment, one or more of the light-emitting element blocks belonging to the second block group each include a smaller number of light-emitting elements connected in series than each of the one or more light-emitting element block belonging to the first block group.

With this structure, in the light-emitting module 130, each of the one or more blocks belonging to the first block group consumes less power than each of the one or more of the blocks belonging to the second block group, as in Embodiments 1-3 described above.

The temperature rise in the middle portion is thus also suppressed in the light-emitting module 130.

As described in Embodiments 1-3, in the light-emitting module 130, power consumption of each of the one or more blocks belonging to the first block group is set to be 85% to 97% of an average power consumption of all the blocks.

(Working Example)

FIG. 9C shows a mounting area of the light-emitting module 130 pertaining to the working example.

In the light-emitting module 130, rows of light-emitting elements (light-emitting element blocks 21-28) each having approximately the same length are arranged in the mounting area as in the light-emitting module 100 described above.

In the light-emitting module 130, in each of the light-emitting element blocks 24 and 25 (the first block group) located in the middle portion, 36 light-emitting elements 12 are connected in series. Also in each of the light-emitting element blocks 22 and 27 belonging to the second block group, 36 light-emitting elements 12 are connected in series.

On the other hand, in each of the light-emitting element blocks 21 and 23, and 26 and 28 belonging to the second block group, 35 light-emitting elements 12 are connected in series, as these light-emitting element blocks each lack one element.

Voltages applied across the respective light-emitting element blocks 21-28 connected in parallel become equal. In each of the light-emitting element blocks 21 and 23, and 26 and 28, an operating voltage of each light-emitting element 12 is relatively high, as the number of light-emitting elements 12 connected in series is relatively small. In each of the light-emitting element blocks, an operating current and power consumption increase. Thus, each of the light-emitting element blocks 22, 24, 25, and 27, which includes 36 light-emitting elements, consumes less power than each of the light-emitting element blocks 21, 23, 26, and 28, which includes 35 light-emitting elements.

Assume that the light-emitting module 130 pertaining to the working example is driven by 124.5 V.

In this case, in each of the light-emitting element blocks 24 and 25 belonging to the first block group, and in each of the light-emitting element blocks 22 and 27 belonging to the second block group, a voltage applied across each of the light-emitting elements 12 is 3.46 V, and a current flowing through each of the light-emitting elements 12 is 45 mA.

On the other hand, in each of the light-emitting element blocks 21, 23, 26, and 28, a voltage applied across each of the light-emitting elements 12 is 3.56 V, and a current flowing through each of the light-emitting elements 12 is 55 mA.

The current flowing through each of the light-emitting element blocks, and the power consumption and the power consumption ratio of each of the light-emitting element blocks are as shown in FIG. 10D. An average current flowing through the light-emitting element blocks is 50 mA.

As shown in FIG. 10D, in the light-emitting module 130, a current flowing through each of the light-emitting element blocks 24 and 25 (the first block group) located in the middle portion is smaller than a current flowing through each of the light-emitting element blocks 21-23 and 26-28 (the second block group). Each of the light-emitting element blocks 24 and 25 consumes less power than each of the light-emitting element blocks 21-23 and 26-28. The temperature rise in the middle portion is thus suppressed in the light-emitting module 130.

[Modifications and the Like of Embodiments 1-4]

1. In Embodiments 1-4, the number of light-emitting element blocks belonging to the first block group is two, and power consumptions of the two light-emitting element blocks are the same. Power consumptions of the light-emitting element blocks belonging to the first block group, however, may not be the same, and may be different.

Furthermore, the number of light-emitting element blocks belonging to the first block group may be one, and may be three or more.

For example, when there are 12 light-emitting element blocks 21-32 as illustrated in FIG. 4, only the light-emitting element block 26 or only the light-emitting element block 27 may belong to the first block group, and the remaining light-emitting element blocks may belong to the second block group.

Alternatively, three light-emitting element blocks 25-27 or three light-emitting element blocks 24-26 may belong to the first block group, and the remaining light-emitting element blocks may belong to the second block group. Furthermore, four light-emitting element blocks 25-28 may belong to the first block group, and the remaining light-emitting element blocks may belong to the second block group.

When there are eight light-emitting element blocks 21-28 as illustrated in FIG. 8, only the light-emitting element block 24 or only the light-emitting element block 25 may belong to the first block group, and the remaining light-emitting element blocks may belong to the second block group. Alternatively, the light-emitting element blocks 23-25 or the light-emitting element blocks 24-26 may belong to the first block group, and the remaining light-emitting element blocks may belong to the second block group. Furthermore, four light-emitting element blocks 23-25 may belong to the first block group, and the remaining light-emitting element blocks may belong to the second block group.

2. In Embodiments 1-4, the phosphor is mixed, as the wavelength conversion material, into the sealing materials so as to convert a wavelength of light emitted from each of the light-emitting elements. The phosphor, however, is not always required.

For example, Embodiments 1-4 described above are applicable to a light-emitting module including LED chips of RGB colors mounted in combination. By setting each of one or more of the light-emitting element blocks belonging to the second block group to consume more power than each of the one or more light-emitting element blocks belonging to the first block group, the temperature rise in the middle portion can be reduced.

3. In Embodiments 1-4, the light-emitting elements are directly mounted on the substrate. However, when the light-emitting elements are primary-sealed, and when a so-called surface mount device (SMD) is secondary-mounted on the substrate, the inventors confirmed that a similar effect is obtained.

4. In Embodiments 2-4, a light-emitting module having a rectangular mounting area is taken as the working example. Embodiments 2-4, however, are applicable to a light-emitting module having a circular mounting area as illustrated in FIG. 4 in Embodiment 1.

The consideration of the effects of the light-emitting module 10 in Embodiment 1 is also applicable to Embodiments 2-4.

5. Two or more of Embodiments 1-4 may be implemented in combination.

REFERENCE SIGNS LIST

10 light-emitting module
11 substrate
12 light-emitting element
12B blue light-emitting element
12R red light-emitting element
12a, 12b light-emitting element
13 sealing member
14, 15 terminal
16, 17 wire
20 mounting area
21-32 light-emitting element block
100 light-emitting module
110 light-emitting module
120 light-emitting module
130 light-emitting module

The invention claimed is:

1. A light-emitting module including a plurality of light-emitting element blocks two-dimensionally arranged on a substrate and connected in parallel, each of the light-emitting element blocks including a plurality of semiconductor light-emitting elements connected in series, wherein the light-emitting element blocks are divided into:

one or more light-emitting element blocks belonging to a first block group, located in a middle portion; and a plurality of light-emitting element blocks belonging to a second block group, located on opposite sides of the first block group, and one or more of the light-emitting element blocks belonging to the second block group each consume more power than each of the one or more light-emitting element blocks belonging to the first block group, wherein the number of light-emitting elements in the first block group and the second block group are the same.

2. The light-emitting module of claim 1, wherein power consumption of each of the one or more light-emitting element blocks belonging to the first block group is not less than 85% and not more than 97% of average power consumption of all the light-emitting element blocks included in the light-emitting module.

3. The light-emitting module of claim 1, wherein semiconductor light-emitting elements include:
　　a first semiconductor light-emitting element; and
　　a second semiconductor light-emitting element having current-voltage characteristics such that a current flowing through the second semiconductor light-emitting element becomes equal to a current flowing through the first semiconductor light-emitting element when a voltage that is lower than a voltage applied to the first semiconductor light-emitting element is applied to the second semiconductor light-emitting element, and the one or more of the light-emitting element blocks belonging to the second block group each include a greater number of second semiconductor light-emitting elements than each of the one or more light-emitting element blocks belonging to the first block group.

4. The light-emitting module of claim 3, wherein the first semiconductor light-emitting element emits light of a shorter wavelength than light emitted from the second semiconductor light-emitting element.

5. The light-emitting module of claim 4, wherein the first semiconductor light-emitting element emits blue light, and
the second semiconductor light-emitting element emits red light.

6. The light-emitting module of claim 3, wherein the second semiconductor light-emitting element is larger in size than the first semiconductor light-emitting element.

7. The light-emitting module of claim 1, wherein the one or more of the light-emitting element blocks belonging to the second block group each additionally include one or more semiconductor light-emitting elements connected in parallel to the semiconductor light-emitting elements connected in series.

8. The light-emitting module of claim 1, wherein the one or more of the light-emitting element blocks belonging to the second block group each include a smaller number of semiconductor light-emitting elements connected in series than each of the one or more light-emitting element blocks belonging to the first block group.

9. The light-emitting module of claim 1, wherein in a region where all semiconductor light-emitting elements are arranged, the semiconductor light-emitting elements each occupy an average area of not more than 3.3 mm$^2$.

10. The light-emitting module of claim 1, wherein a total number of semiconductor light-emitting elements arranged on the substrate is not less than 40 and not more than 520.

11. The light-emitting module of claim 1, wherein the substrate includes a layer made of a ceramic material.

12. The light-emitting module of claim 1, wherein the semiconductor light-emitting elements included in each of the light-emitting element blocks are electrically connected by direct wire bonding.

\* \* \* \* \*